United States Patent
Chou et al.

(10) Patent No.: US 8,975,530 B2
(45) Date of Patent: Mar. 10, 2015

(54) PRINTED CIRCUIT BOARD WITH CONNECTING WIRES

(71) Applicants: Hui-Hsuan Chou, New Taipei (TW); Shih-Ming Huang, New Taipei (TW)

(72) Inventors: Hui-Hsuan Chou, New Taipei (TW); Shih-Ming Huang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 214 days.

(21) Appl. No.: 13/669,472

(22) Filed: Nov. 6, 2012

(65) Prior Publication Data

US 2013/0118785 A1    May 16, 2013

(30) Foreign Application Priority Data

Nov. 14, 2011    (TW) .............. 100221461 U

(51) Int. Cl.
*H05K 1/09*    (2006.01)
*H05K 1/11*    (2006.01)
*H05K 1/02*    (2006.01)

(52) U.S. Cl.
CPC .............. *H05K 1/0265* (2013.01); *H05K 1/111* (2013.01); *H05K 2201/0979* (2013.01)
USPC .......................................... 174/257; 174/255

(58) Field of Classification Search
CPC ................ H05K 1/0265; H05K 1/111; H05K 2201/0979; H05K 1/09; H05K 1/11
USPC .................................... 174/257, 255
See application file for complete search history.

(56) References Cited

U.S. PATENT DOCUMENTS

| | | | |
|---|---|---|---|
| 7,271,028 B1 * | 9/2007 | Pace | 438/107 |
| 2004/0155359 A1 * | 8/2004 | Shen | 257/782 |
| 2010/0230826 A1 * | 9/2010 | Fu | 257/777 |

* cited by examiner

*Primary Examiner* — Timothy Thompson
*Assistant Examiner* — Charles Pizzuto
(74) *Attorney, Agent, or Firm* — Novak Druce Connolly Bove + Quigg LLP

(57) ABSTRACT

A printed circuit board (PCB) includes a substrate, a pad, a plurality of connecting wires and a plurality of separating portions. The pad arranged on at least one surface of the substrate. The plurality of connecting wires increase contact area of the pad and a copper foil around the pad to keep the current of the PCB steady when a lot of current flow through the PCB. The plurality of separating portions located on between the pad and the copper foil around the pad to divide the pad and the copper foil to avoid short-circuit when the copper foil is etched.

5 Claims, 1 Drawing Sheet

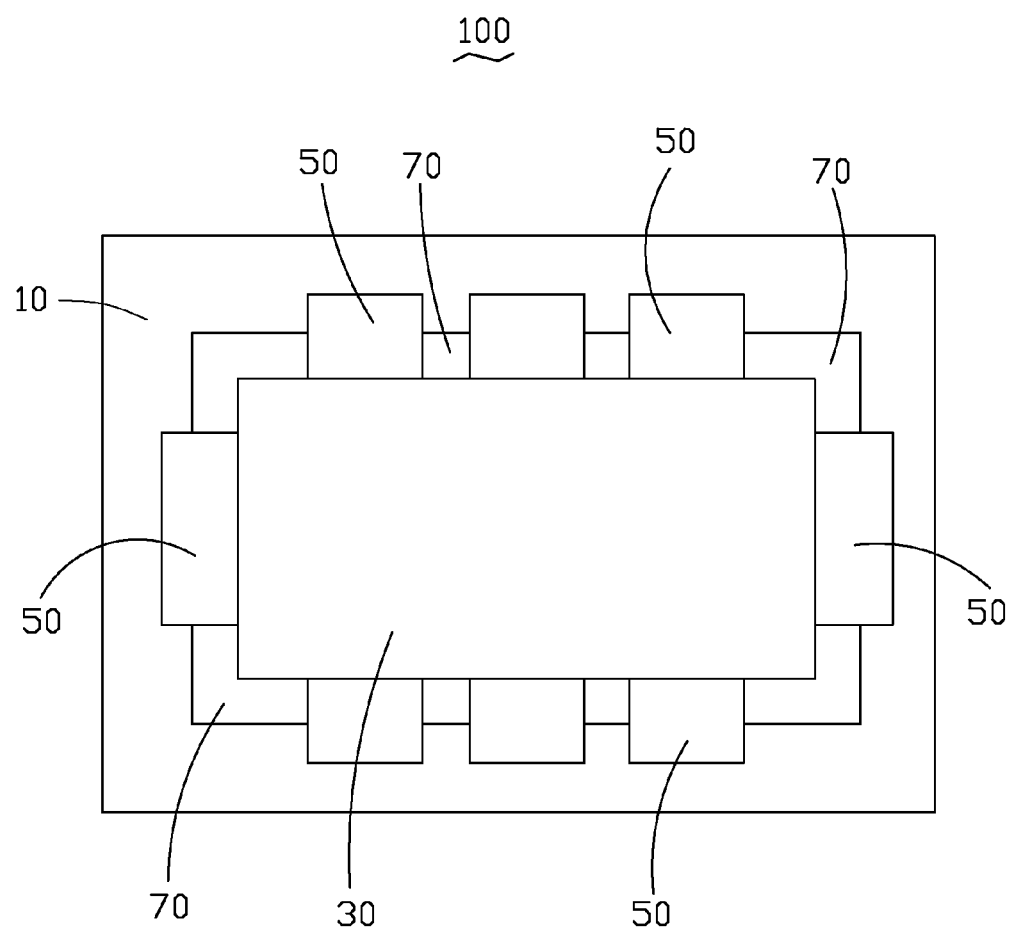

PRINTED CIRCUIT BOARD WITH CONNECTING WIRES

BACKGROUND

1. Technical Field

The present disclosure relates to printed circuit boards (PCBs), and more particularly to a printed circuit board with connecting wires.

2. Description of Related Art

A plurality of electronic components generally can be soldered onto a printed circuit board (PCB) by a pad. Because connecting wires connected to a copper foil of the PCB and the pad are often not wide enough, input and/or output of current is disturbed and the current tends to be unstable.

BRIEF DESCRIPTION OF THE DRAWING

The FIGURE is a top view of a printed circuit board (PCB) in accordance with the present disclosure.

DETAILED DESCRIPTION

The FIGURE is a top view of a printed circuit board (PCB) 100 in accordance with the present disclosure. The PCB 100 includes a substrate 10, a pad 30, a plurality of connecting wires 50, and a plurality of separating portions 70. In one embodiment, the PCB 100 is a double layer PCB or a multi-layer PCB.

The substrate 10 includes a metal layer, such as a copper foil, as a grounded layer and a power layer for electric conduction between electronic components (not shown) and a signal layer of the substrate 10.

The pad 30 is arranged on at least one surface of the substrate 10 to solder the electronic components to the pads. In one embodiment, the pad 30 may be a substantially oblong copper foil.

The plurality of connecting wires 50 and a copper foil are positioned around the pad 30. The plurality of connecting wires 50 increase contact area of the pad 30 and the copper foil positioned around the pad 30 to keep current of the PCB 100 steady when a lot of current flows through the PCB 100.

In one embodiment, width of the plurality of connecting wires 50 may be calculated according to a formula: $Y=W*X+8(X+1)$, where W is width of one of the plurality of connecting wires 50, Y is width or length of the pad 30, and X is a number of the plurality of connecting wires 50. Width of each of the plurality of connecting wires 50 is proportional to width or length of the pad 30, and inversely proportional to the number of the connecting wires 50. The number of the plurality of connecting wires 50 (hereinafter X) and the width of each of the plurality of connecting wires 50 (hereinafter W) can be calculated according to a following method: measuring width of the pad 30 (hereinafter Y), estimating Width of each of the plurality of connecting wires 50 according to the current that flows through the PCB 100, calculating X' according to the estimated width of each of the plurality of connecting wires 50 and Y by formula: $Y=\text{the estimated width}*X'+8(X'+1)$, obtaining X which is an integer of X'; and calculating W according to X and Y by formula: $Y=W*X+8(X+1)$. Width of a connecting wire generally is at least about 40 millimeters (mm) when one ampere of current flows through the PCB 100. In one embodiment, if current that flows through the PCB 100 is 0.4 amperes, width of each of the connecting wires 50 may be at least about 16 mm. The calculating method can make both width of each of the connecting wires 50 and the number of the connecting wires 50 to be optimal.

For example, if width (Y) of the pad 30 is 78 mm and width (W) of each of the plurality of connecting wires 50 is 16 mm, the number of the plurality of connecting wires 30 is two (namely from formula $78=16*X+8(X+1)$) and width (W) of each of the plurality of connecting wires 50 is 27 mm (namely from formula $78=W*2+8(2+1)$).

For example, if width (Y) of the pad 30 is 80 mm and width (W) of each of the plurality of connecting wires 50 is 16 mm, the number of the plurality of connecting wires 30 is three (namely from formula $80=16*X+8(X+1)$), and width (W) of each of the plurality of connecting wires 50 is 16 mm (namely from formula $80=W*3+8(3+1)$).

Both width of the each of the plurality of connecting wires 50 and the number of the plurality of connecting wires 50 can be calculated according to the formula. That is, a contact area can be improved in a smaller amount of space, which can increase contact area of the pad 30 and the copper foil around the pad 30. Accordingly, the current of the PCB 100 can be kept steady to avoid disturbing the input and/or output of currents because of the small contact area when a lot of current flows through the PCB 100.

The plurality of separating portions 70 penetrate the substrate 10 and disposed between the pad 30 and the copper foil positioned around the pad 30 to divide the pad 30 and the copper foil to avoid short-circuits when the copper foil is etched. In one embodiment, each of the plurality of separating portions 70 is positioned between two of the connecting wires 50 to separate each of the plurality of connecting wires 50. Each of the plurality of separating portions 70 is an etched hollow area between a reference metal layer of the substrate 10 and the pad 30.

While an embodiment of the present disclosure has been described above, it should be understood that it has been presented by way of example only and not by way of limitation. Thus the breadth and scope of the present disclosure should not be limited by the above-described embodiments but should be defined only in accordance with the following claims and their equivalents.

What is claimed is:

1. A printed circuit board (PCB), comprising:
   a substrate;
   a pad arranged on at least one surface of the substrate;
   a plurality of connecting wires and a copper foil positioned around the pad;
   a plurality of separating portions disposed between the pad and the copper foil positioned around the pad.

2. The PCB as recited in claim 1, wherein each of the plurality of separating portions is positioned between two of the connecting wires to separate each of the plurality of connecting wires.

3. The PCB as recited in claim 2, wherein each of the plurality of separating portions is an etched hollow area between a reference metal layer of the substrate and the pad.

4. The PCB as recited in claim 1, wherein width of each of the plurality of connecting wires is proportional to width or length of the pad.

5. The PCB as recited in claim 4, wherein width of each of the plurality of connecting wires is inversely proportional to a number of the connecting wires.

* * * * *